(12) United States Patent
Inoue et al.

(10) Patent No.: US 7,479,846 B2
(45) Date of Patent: Jan. 20, 2009

(54) DUPLEXER

(75) Inventors: Shogo Inoue, Kawasaki (JP); Yasuhide Iwamoto, Kawasaki (JP); Takashi Matsuda, Kawasaki (JP); Masanori Ueda, Yokohama (JP)

(73) Assignees: Fujitsu Media Devices Limited, Yokohama (JP); Fujitsu Limited, Tokyo (JP)

( * ) Notice: Subject to any disclaimer, the term of this patent is extended or adjusted under 35 U.S.C. 154(b) by 0 days.

(21) Appl. No.: 11/262,765

(22) Filed: Nov. 1, 2005

(65) Prior Publication Data

US 2006/0091977 A1 May 4, 2006

(30) Foreign Application Priority Data

Nov. 2, 2004 (JP) .............................. 2004-319897

(51) Int. Cl.
H03H 9/64 (2006.01)
H03H 9/72 (2006.01)
(52) U.S. Cl. ....................................... 333/133; 333/193
(58) Field of Classification Search .................. 333/133, 333/134, 193
See application file for complete search history.

(56) References Cited

U.S. PATENT DOCUMENTS

| 5,175,518 | A | | 12/1992 | Swanson, Jr. | |
|---|---|---|---|---|---|
| 5,920,241 | A | | 7/1999 | Mazzochette | |
| 5,932,950 | A | | 8/1999 | Yamada et al. | |
| 6,351,195 | B1 | * | 2/2002 | Atokawa et al. | ............. 333/134 |
| 6,621,378 | B2 | * | 9/2003 | Naruse et al. | ................ 333/185 |
| 6,700,061 | B2 | * | 3/2004 | Kishimoto | ................... 174/377 |
| 6,897,740 | B2 | * | 5/2005 | Fujino et al. | ................. 333/133 |
| 6,943,645 | B2 | * | 9/2005 | Taniguchi | .................... 333/133 |
| 7,023,297 | B2 | * | 4/2006 | Taniguchi et al. | ............ 333/133 |
| 7,119,634 | B2 | * | 10/2006 | Sakano et al. | ................ 333/133 |
| 7,135,944 | B2 | * | 11/2006 | Iwamoto et al. | .............. 333/133 |
| 2001/0052830 | A1 | | 12/2001 | Noguchi et al. | |
| 2002/0140081 | A1 | | 10/2002 | Chou et al. | |
| 2002/0186097 | A1 | * | 12/2002 | Sakuragawa et al. | ......... 333/133 |
| 2003/0132817 | A1 | * | 7/2003 | Nagai | .......................... 333/133 |
| 2005/0046512 | A1 | * | 3/2005 | Kihara et al. | ................ 333/133 |
| 2006/0022767 | A1 | * | 2/2006 | Taniguchi et al. | ............ 333/133 |

FOREIGN PATENT DOCUMENTS

| CN | 1356861 | 7/2002 |
|---|---|---|
| EP | 0 527 468 | 2/1993 |

(Continued)

OTHER PUBLICATIONS

Masanori UEDA et al; Ultra-Miniaturized and High Performance PCS Saw Duplexer with Steep Cut-Off Filters; *Microwave Symposium Digest 2004 IEEE*; Jun. 6, 2004; pp. 913-916.

(Continued)

*Primary Examiner*—Seungsook Ham
(74) *Attorney, Agent, or Firm*—Arent Fox LLP

(57) ABSTRACT

A duplexer that includes: a transmission filter and a reception filter that are connected to a common terminal; and a reactance circuit that is connected to at least one of the transmission filter and the reception filter. The reactance circuit includes an insulating substrate, lumped-constant inductors, and at least one capacitor. The lumped-constant inductors and the capacitor are formed directly on the surface of the insulating substrate.

10 Claims, 20 Drawing Sheets

FOREIGN PATENT DOCUMENTS

| | | | |
|---|---|---|---|
| JP | 7-263995 A | | 10/1995 |
| JP | 9-98046 A | | 4/1997 |
| JP | 11068512 A | * | 3/1999 |
| JP | 2000-252125 A | | 9/2000 |
| JP | 2002176337 A | * | 6/2002 |
| JP | 2003-249842 A | | 9/2003 |
| JP | 2003249842 A | * | 9/2003 |
| JP | 3487692 | | 10/2003 |
| JP | 2003-347964 A | | 12/2003 |
| JP | 2004-228911 | | 8/2004 |

OTHER PUBLICATIONS

J. H. Visser et al; On-Chip Saw Filters In Integrated Radio Systems; *Proceedings of the International Conference on Consumer Electronics;* ndew vol. conf. 8, Jun. 6, 1989; pp. 90-91.

Harrie A. C. Tilmans et al; Mems for Wireless Communications; from RF-MEMS Components to RF-MEMS-SIP; *Journal of Micromechanics and Microengineering Iop Publishing UK;* vol. 13; No. 4; Jun. 13, 2003; pp. S139-S163.

K. Anemogiannis et al; A 900 MHZ Saw Microstrip Antenna-Duplexer for Mobile Radio; *1990 IEE MTT-S Digest;* May 8, 1990; pp. 729-732.

* cited by examiner

C-L-C TYPE

L-C-L π TYPE

L-C-L T TYPE

C-L-C T TYPE

- 25 signal pad
- 21 quartz substrate
- 24 series capacitor
- 26 signal pad
- 27 ground pad
- 22 parallel inductor (spiral coil)
- 23 parallel inductor (spiral coil)
- 28 ground pad

- 27 pad
- 22 spiral coil
- 24a upper electrode
- 24 series capacitor
- 23 spiral coil
- 28 pad
- 24c lower electrode
- 24b dielectric film
- 21 quartz substrate series inductor series capacitor parallel capacitor parallel inductor series inductor
and parallel capacitor series capacitor
and parallel inductor

DUPLEXER

BACKGROUND OF THE INVENTION

1. Field of the Invention

The present invention generally relates to duplexers, and more particularly, to a duplexer that utilizes surface acoustic wave (SAW).

2. Description of the Related Art

So as to separate transmission and reception signals from other signals, antenna duplexers with surface acoustic wave (SAW) filters are mounted in most mobile-phone handsets today. Each of the SAW duplexers includes a transmission SAW filter, a reception SAW filter, and a matching circuit that is interposed between the reception filter and the connecting point of the transmission and reception filters. This matching circuit is provided for guiding each transmission signal from the transmission filter toward an antenna terminal and for preventing each transmission signal from flowing into the reception filter. Normally, the matching circuit is formed with a distributed-constant line such as a microstrip line or a strip line, as shown in FIG. 1. A microstrip line or a strip line may be incorporated into the package in which the SAW filters are to be mounted, or may be formed on the printed board on which the SAW filters are to be mounted. As the mobile-phone handsets are becoming more and more sophisticated, there is an increasing demand for devices that are small in size and height. However, a conventional duplexer with a distributed-constant line cannot be made smaller or shorter, because a very long line is required as the distributed-constant line.

So as to solve this problem, Japanese Patent No. 3487692 and Japanese Unexamined Patent Publication No. 2004-228911 disclose the techniques of replacing the distributed-constant lines as the matching circuits with lumped-constant circuits. As shown in FIG. 2, instead of a line, a π-type circuit that is formed with a parallel capacitor, a series inductor, and a parallel capacitor is interposed between the reception filter and the connecting point of the transmission and reception filters. With this structure, a long line becomes unnecessary, and the device can be made much smaller and shorter.

However, by the technique using conventional lumped-constant circuits as matching circuits, the reactance elements such as inductors and capacitors are formed with bulk components (chip inductors or chip capacitors) or are incorporated into the package that contains SAW filters. With such a structure, the device cannot be minimized in size and height. On the other hand, U.S. Pat. No. 5,175,518 discloses a lumped-constant inductor that has a dielectric film formed on an insulating substrate such as alumina, and has a pattern formed on the dielectric film. U.S. Pat. No. 5,175,518 also discloses a capacitor that has a dielectric film interposed between electrodes on an insulating substrate. However, with a dielectric film being formed on an insulating substrate, the capacity coupling between adjacent inductors on the dielectric film becomes large due to the large dielectric constant of the dielectric film. As a result, the loss increases because of the resonance caused between the adjacent inductors, and the isolation characteristics deteriorate due to the coupling between the adjacent inductors. For this reason, the lumped-constant inductor and the capacitor disclosed in U.S. Pat. No. 5,175,518 are not suitable for the phase-matching circuits of SAW filters that need to exhibit low insertion loss in the band and high isolation characteristics. This presents the problem in producing a duplexer with excellent filter characteristics.

SUMMARY OF THE INVENTION

It is therefore an object of the present invention to provide a duplexer in which the above disadvantage is eliminated.

A more specific object of the present invention is to provide a duplexer with excellent filter characteristics that exhibit low in-band insertion loss and high isolation characteristics, though the duplexer is small in size.

According to one aspect of the present invention, there is provided a duplexer including: a transmission filter and a reception filter that are connected to a common terminal; and a reactance circuit that is connected to at least one of the transmission filter and the reception filter, the reactance circuit including an insulating substrate, a plurality of lumped-constant inductors, and at least one capacitor, the plurality of lumped-constant inductors and the at least one capacitor being formed directly on the surface of the insulating substrate.

According to another aspect of the present invention, there is provided a duplexer including: a transmission filter and a reception filter that are connected to a common terminal; and a reactance circuit that is designed for phase matching and is connected to at least one of the transmission filter and the reception filter, the reactance circuit including an insulating substrate and at least one of a lumped-constant inductor and a capacitor, the lumped-constant inductor and the capacitor being formed directly on the surface of the insulating substrate, an inductor to be connected to at least one of the transmission filter and the reception filter being formed directly on the surface of the insulating substrate.

According to yet another aspect of the present invention, there is provided a duplexer including: a transmission filter and a reception filter that are connected to a common terminal; and a reactance circuit that is connected to at least one of the transmission filter and the reception filter, the transmission filter, the reception filter, and the reactance circuit being formed on a piezoelectric substrate.

The present invention can provide a duplexer with excellent filter characteristics that exhibit low in-band insertion loss and high isolation characteristics, though the duplexer is small in size.

BRIEF DESCRIPTION OF THE DRAWINGS

Other objects, features and advantages of the present invention will become more apparent from the following detailed description when read in conjunction with the accompanying drawings, in which.

DESCRIPTION OF THE PREFERRED EMBODIMENTS

The following is a detailed description of embodiments of the present invention, with reference to the accompanying drawings.

First Embodiment

Figure 1:
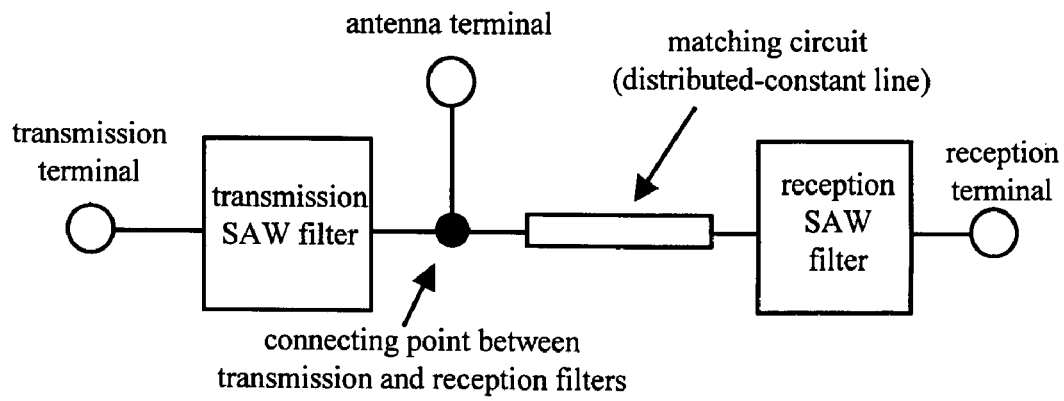
FIG. 1 illustrates an example of a conventional surface acoustic wave duplexer.
Figure 2:
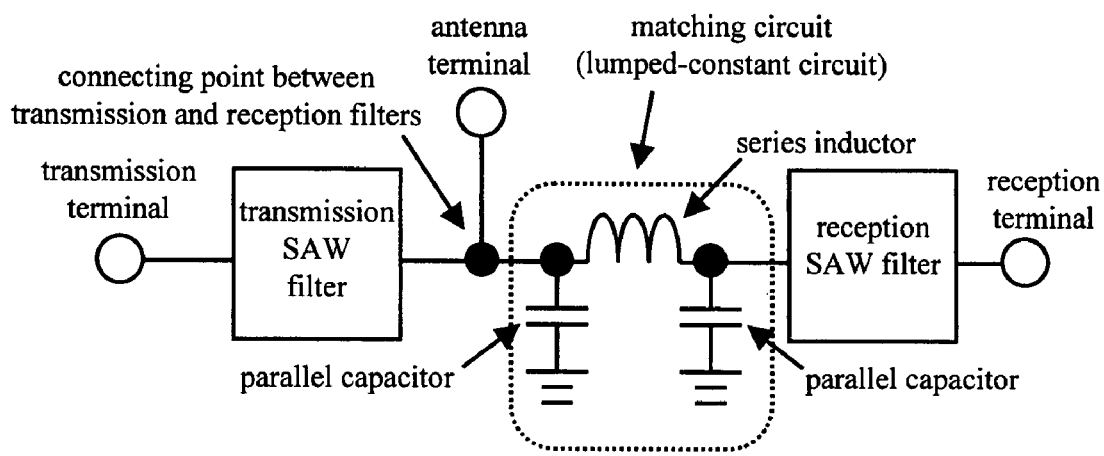
FIG. 2 illustrates another example of a conventional surface acoustic wave duplexer.
Figure 3:
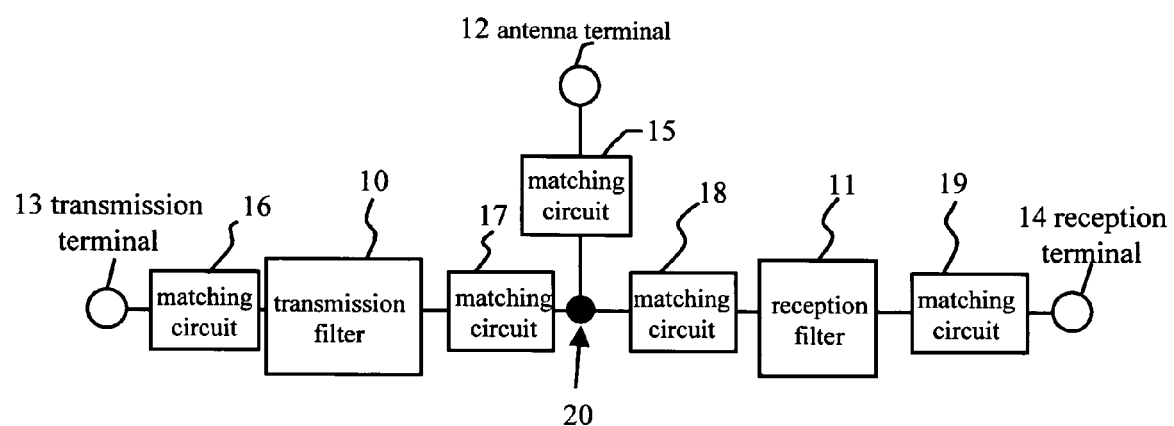
FIG. 3 illustrates the structure of a duplexer in accordance with a first embodiment of the present invention.

FIG. 3 is a block diagram of a duplexer in accordance with a first embodiment of the present invention. The duplexer includes a transmission filter 10, a reception filter 11, an antenna terminal (a common terminal) 12, a transmission terminal 13, and 1 reception terminal 14. The transmission filter 10 and the reception filter 11 are surface acoustic wave (SAW) filters. In the following, the transmission filter 10 and the reception filter 11 may also be referred to as a transmission SAW filter 10 and a reception SAW filter 11. The duplexer also includes phase matching circuits 15 through 19. However, the duplexer of the present invention does not need to include the phase matching circuits 15 through 19. Rather, the phase matching circuits 15 through 19 are selectively employed so as to obtain desired characteristics. For example, only the matching circuit 18 may be employed. The matching circuits in the duplexer are reactance circuits that are formed with lumped-constant reactance elements.

The matching circuit 15 is disposed between the antenna terminal 12 and the connecting point 20 of the transmission filter 10 and the reception filter 11. The matching circuit 16 is disposed between the transmission terminal 13 and the transmission filter 10. The matching circuit 17 is disposed between the transmission filter 10 and the connecting point 20. The matching circuit 18 is disposed between the connecting point 20 and the reception filter 11. The matching circuit 19 is disposed between the reception filter 11 and the reception terminal 14. The matching circuit 15 is provided for impedance matching of the antenna terminal 12. The matching circuit 16 is provided for impedance matching of the transmission terminal 13. The matching circuit 17 is provided for preventing a reception signal from flowing into the transmission filter 10. Here, the reception signal is input through the antenna terminal 12. The matching circuit 18 is provided for preventing a transmission signal from flowing into the reception filter 11. The matching circuit 19 is provided for impedance matching of the reception terminal 14. These matching circuits are phase-matching reactance circuits that change signal phases.

Figure 4A:
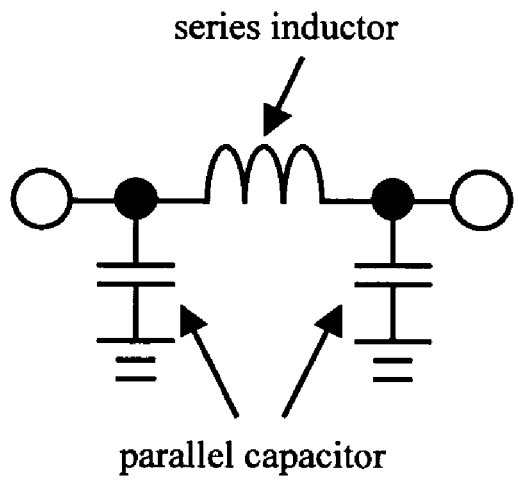
FIGS. 4A through 4D illustrate examples structures of lumped-constant circuits to be used for the matching circuits shown in FIG. 3.
Figure 4B:
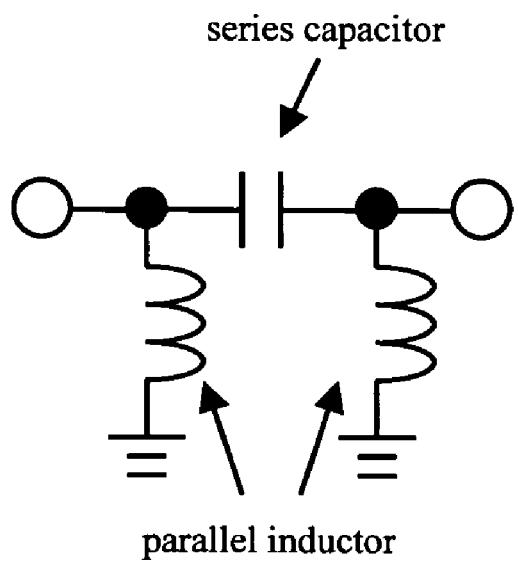
Figure 4C:
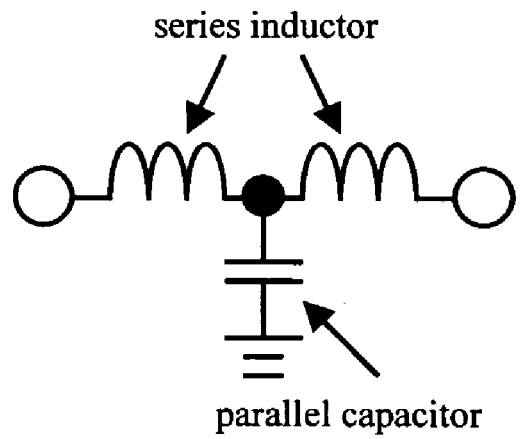
Figure 4D:
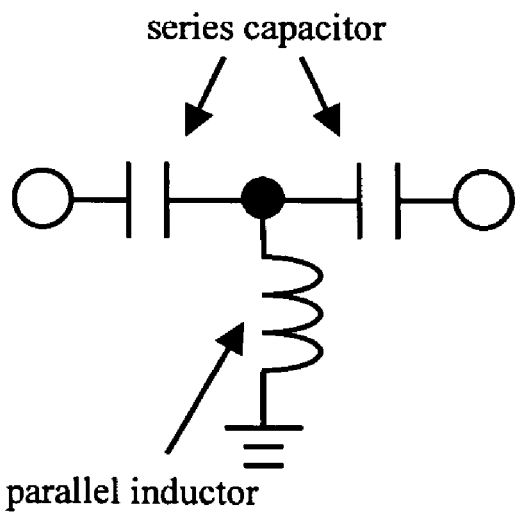

FIGS. 4A through 4D illustrate example structures of the matching circuits 17 and 18. Although each of the structures illustrated in FIGS. 4A through 4D includes three reactance elements (inductors and capacitors), the number of reactance elements is not limited to three and may be more than three or less than three. More specifically, FIG. 4A illustrates a π-type lumped-constant matching circuit that is formed with two parallel capacitors and one series inductor. FIG. 4B illustrates a π-type lumped-constant matching circuit that is formed with one series capacitor and two parallel inductors. FIG. 4C illustrates a T-type lumped-constant matching circuit that is formed with one parallel capacitor and two series inductors. FIG. 4D illustrates a T-type lumped-constant matching circuit that is formed with two series capacitors and one parallel inductor.

Figure 5A:
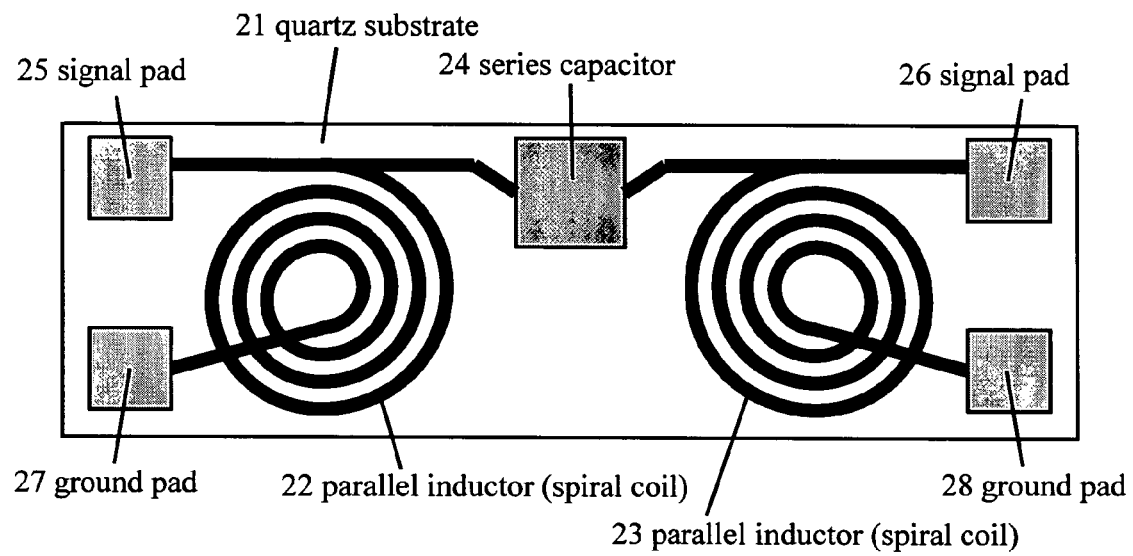
FIG. 5A is a plan view of a lumped-constant matching circuit to be employed in the duplexer of the present invention.
Figure 5B:
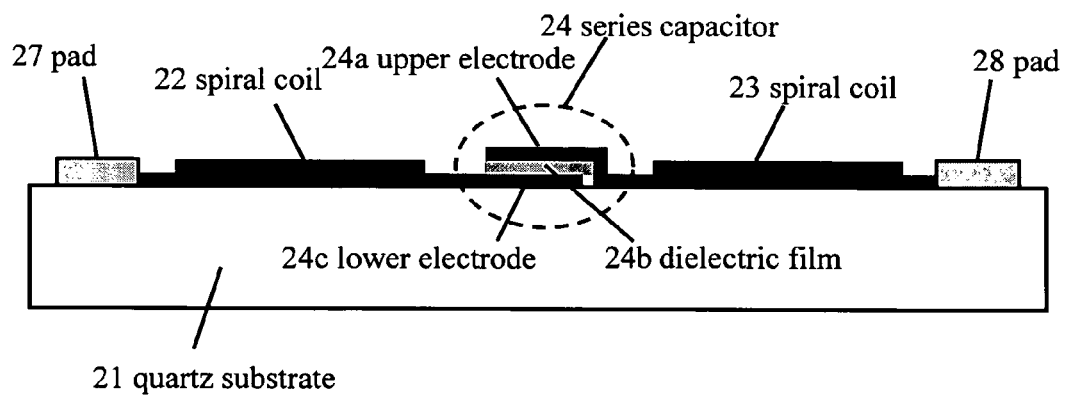
FIG. 5B is a front view of the lumped-constant matching circuit.
Figure 6:
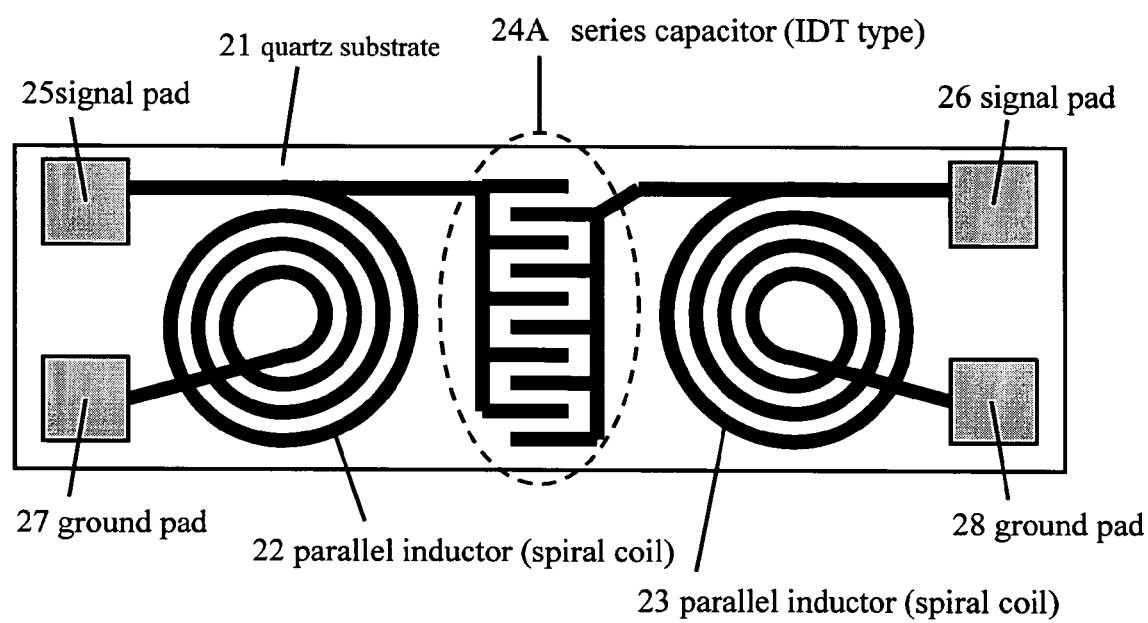
FIG. 6 is a plan view of another example structure of a lumped-constant matching circuit to be employed in the duplexer of the present invention.

The present invention is embodied by forming the above lumped-constant matching circuits directly on the surface of a high-resistance chip (an insulating substrate) made of glass or quartz, for example. FIGS. 5A and 5B illustrate an example structure formed by disposing the circuit structure of FIG. 4B directly on the surface of a quartz chip 21 (hereinafter referred to as the quartz substrate 21). FIG. 5A is a plan view of a lumped-constant matching circuit, and FIG. 5B is a front view of the lumped-constant matching circuit. The inductors (the parallel inductors in the structure of FIG. 4B) are spiral coils 22 and 23 that are formed directly on the surface of the quartz substrate 21. The spiral coils 22 and 23 are formed with patterned conductive materials such as metallic materials. The spiral coils 22 and 23 do not necessarily take round shapes, but may be presented in any forms, such as oval shapes or rectangular shapes. The capacitor (the series capacitor in the structure of FIG. 4B) 24 has a dielectric film 24b interposed between an upper electrode 24a and a lower electrode 24c. The dielectric film 24b may be made of $SiO_2$, for example. The capacitor 24 does not necessarily have this structure, but it is possible to employ an IDT (Interdigital Transducer) capacitor 24A with comb-like electrodes as shown in FIG. 6. Referring back to FIGS. 5A and 5B, signal pads 25 and 26 and ground pads 27 and 28 are formed on the quartz substrate 21. The extraction lines of the spiral coils 22 and 23 cross over an insulating film (not shown) formed on the spiral coils 22 and 23, and are connected to the ground pads 27 and 28, respectively.

The dielectric constant of the quartz substrate 21 or an insulating substrate formed with an insulator is small. Accordingly, the capacity coupling between the spiral coils 22 and 23, which are inductors formed directly on the surface of the quartz substrate 21, is small, and the interference due to the spiral coils 22 and 23 is small. As a result, a lumped-constant matching circuit with low insertion loss and high isolation can be realized, and the characteristics of the duplexer can be improved. Since one duplexer includes more than one inductor, it is particularly advantageous to be able to restrict the interference between the lumped-constant inductors integrated on one substrate. Also, with the matching circuits being formed on the surface of the chip-like quartz substrate 21, the duplexer can be made much smaller and shorter.

Figure 7A:
FIGS. 7A through 7F illustrate example structures of lumped-constant circuits to be employed for the matching circuits shown in FIG. 3.
Figure 7B:
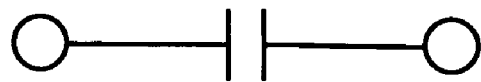
Figure 7C:
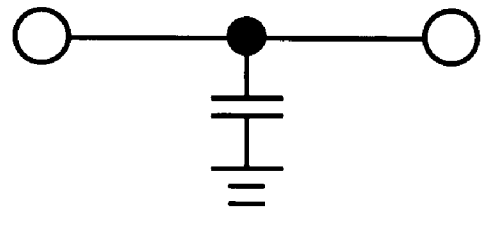
Figure 7D:
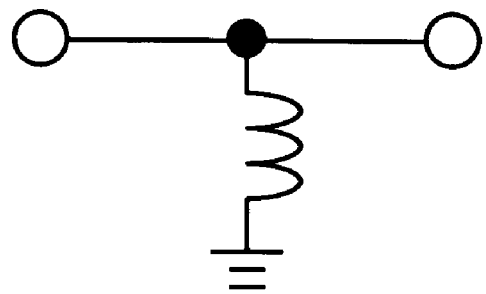
Figure 7E:
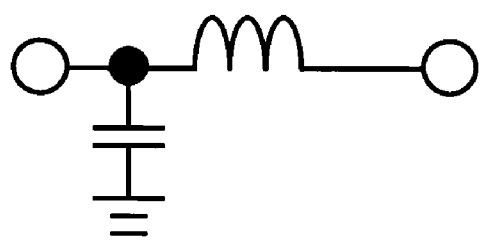
Figure 7F:
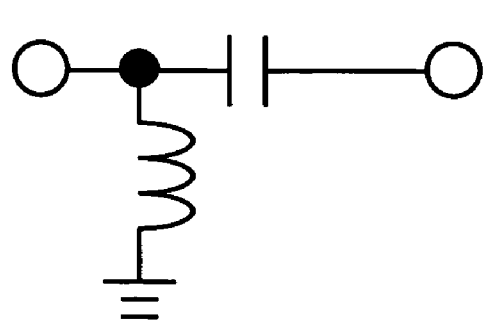

FIGS. 7A through 7F illustrate example structures of the matching circuits 15, 16, and 17. FIGS. 7A through 7D each illustrate a structure with one reactance element. FIGS. 7E and 7F each illustrate a structure with two reactance elements. However, each of the matching circuits 15, 16, and 17 is not limited to those structures, and may include three or more reactance elements. When the matching circuit illustrated in FIG. 7E or FIG. 7F is added to the duplexer, the direction of the circuit to be connected may be arbitrarily set.

Figure 8:
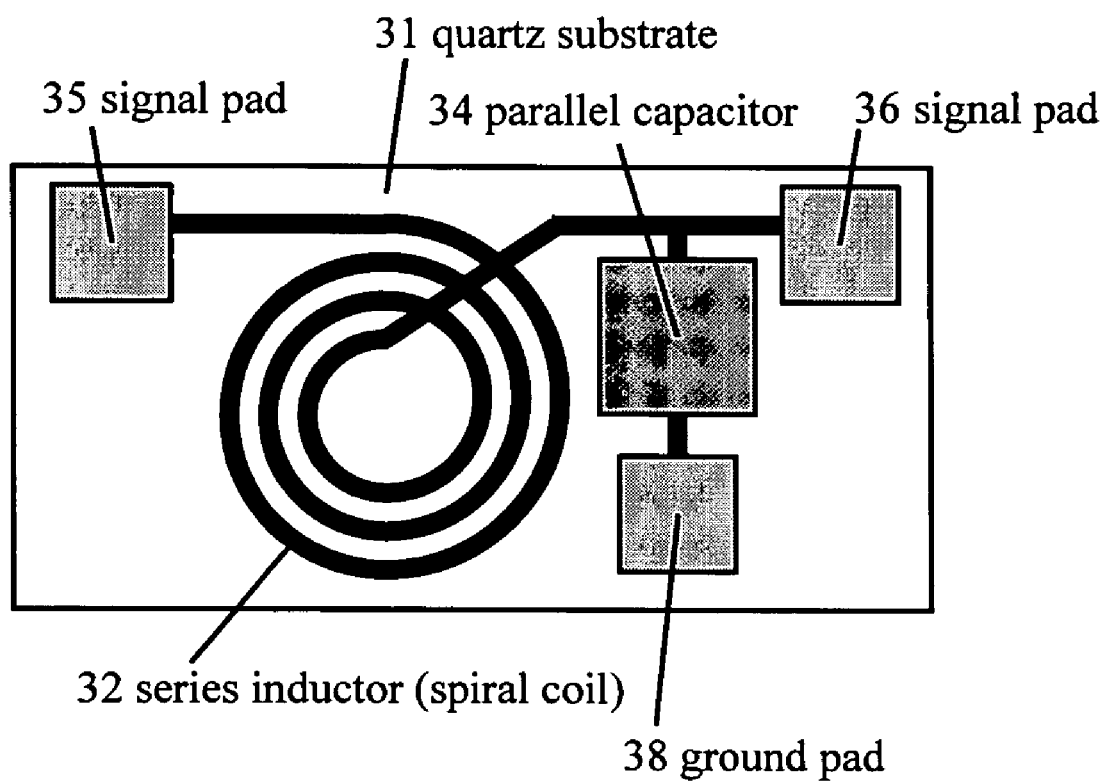
FIG. 8 is a plan view of yet another example structure of a lumped-constant matching circuit to be employed in the duplexer of the present invention.

FIG. 8 illustrates an example structure in which the circuit structure of FIG. 7E is formed on the surface of a quartz substrate 31. A series inductor 32 is a spiral coil. The spiral coil 32 does not necessarily take a round shape, but may be in any form such as an oval shape or a rectangular shape. Like the capacitor 24 shown in FIG. 5B, a parallel capacitor 34 has a dielectric film interposed between an upper electrode and a lower electrode. The parallel capacitor 34 does not necessarily have this structure, but may be of the IDT type with comb-like electrodes, like the capacitor 24A shown in FIG. 6. Both ends of the spiral coil 32 are connected to signal pads 35 and 36 that are formed on the quartz substrate 31. One end of the parallel capacitor 34 is connected to a ground pad 38 that is also formed on the quartz substrate 31. With the matching circuit formed on the surface of one chip as shown in FIG. 8, a duplexer that is much smaller and lower than a conventional duplexer can be realized.

Figure 9:
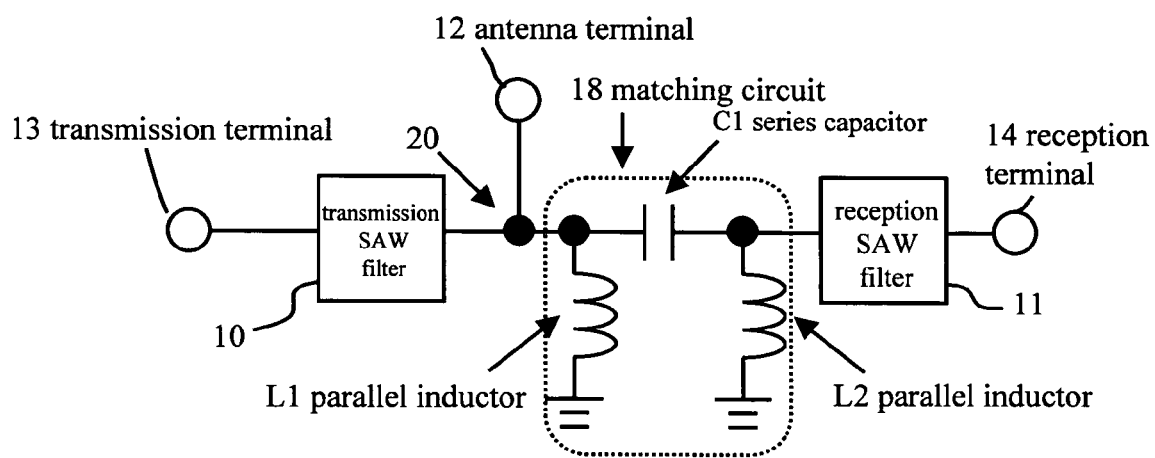
FIG. 9 illustrates an example structure of the duplexer of the present invention that includes only one of the matching circuits shown in FIG. 3.

FIG. 9 illustrates the structure of a duplexer that includes only the matching circuit 18 of the above described matching circuits 15 through 19. The matching circuit 18 has the circuit structure illustrated in FIG. 4B (for ease of explanation, the series capacitor is denoted by C1, and the two parallel inductors are denoted by L1 and L2 in FIG. 9). FIGS. 5A and 5B illustrate the structure of the matching circuit 18 in greater detail.

Figure 10:
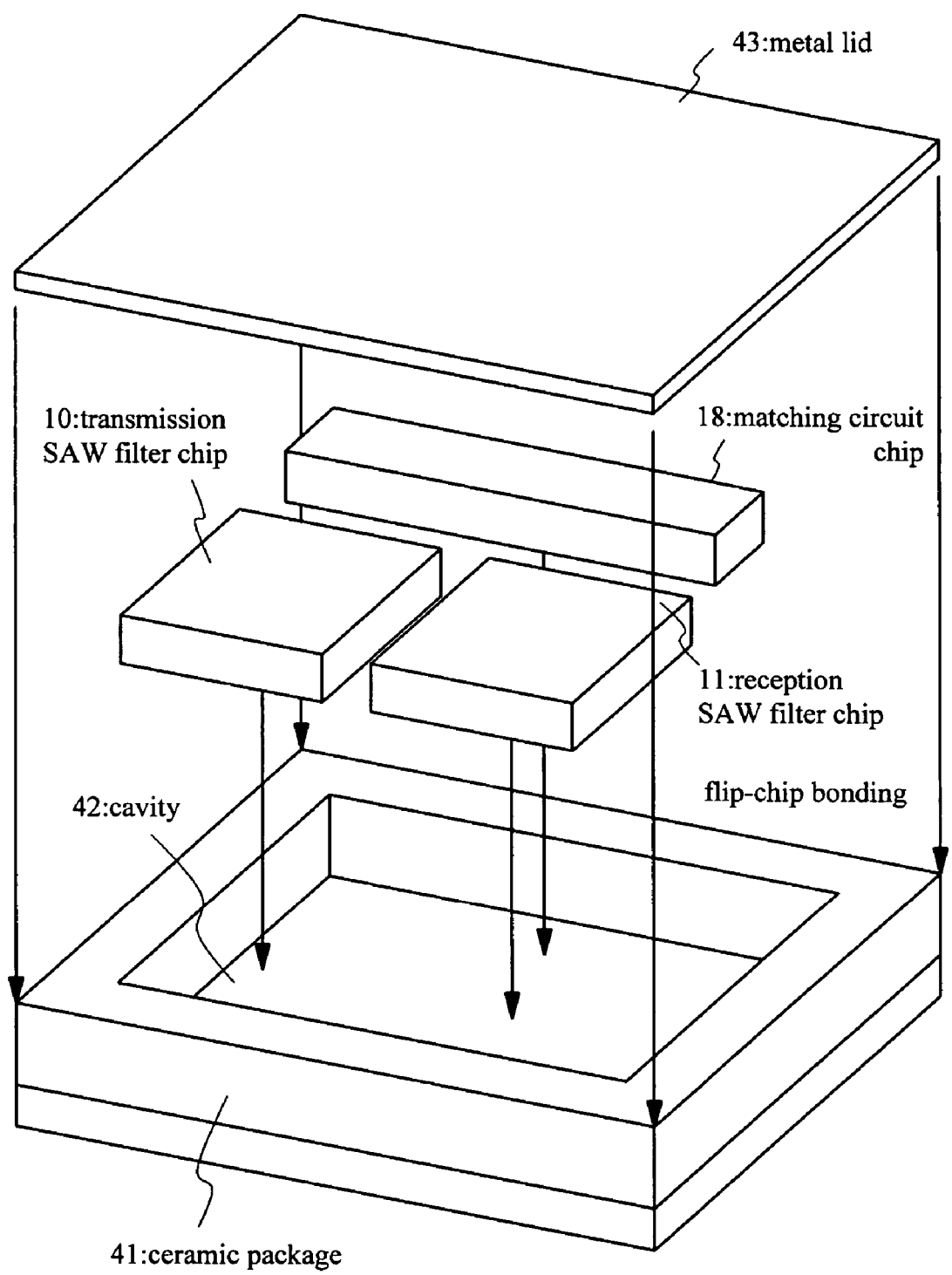
FIG. 10 is an exploded perspective view of the duplexer in accordance with the first embodiment.

FIG. 10 is an exploded perspective view of the duplexer of this embodiment that includes the matching circuit 18 as shown in FIG. 9. In the structure shown in FIG. 10, the transmission filter 10 (see FIG. 3) and the reception filter 11 are formed with SAW filter chips that are independent of each other. As shown in FIG. 10, the chip of the transmission filter 10 (the transmission SAW filter chip), the chip of the reception filter 11 (the reception SAW filter chip), and the chip of the matching circuit 18 (the matching circuit chip) are mounted in a cavity 42 of a ceramic package 41 by flip-chip bonding. A wiring pattern including pads is formed on the bottom surface of the cavity 42 of the ceramic package 41, so that the signal pads 25 and 26 and the ground pads 27 and 28 shown in FIG. 5A are bonded to the corresponding pads. Accordingly, the antenna terminal 12, the transmission terminal 13, the reception terminal 14, and the ground terminal, which are formed by the pattern provided on the bottom surface of the ceramic package, are electrically connected to the circuits formed on the chips of the transmission filter 10 and the reception filter 11, and the circuit formed on the chip of the matching circuit 18. The cavity 42 is hermetically sealed by a metal lid 43. With this structure of the present invention, a surface acoustic wave duplexer that is much smaller and shorter than a conventional duplexer can be realized, and improved characteristics can be achieved by virtue of the smaller capacity coupling between adjacent inductors. Also, a duplexer that includes another matching circuit chip, instead of the matching circuit 18, can be formed with the same structure as above.

Second Embodiment

Figure 11A:
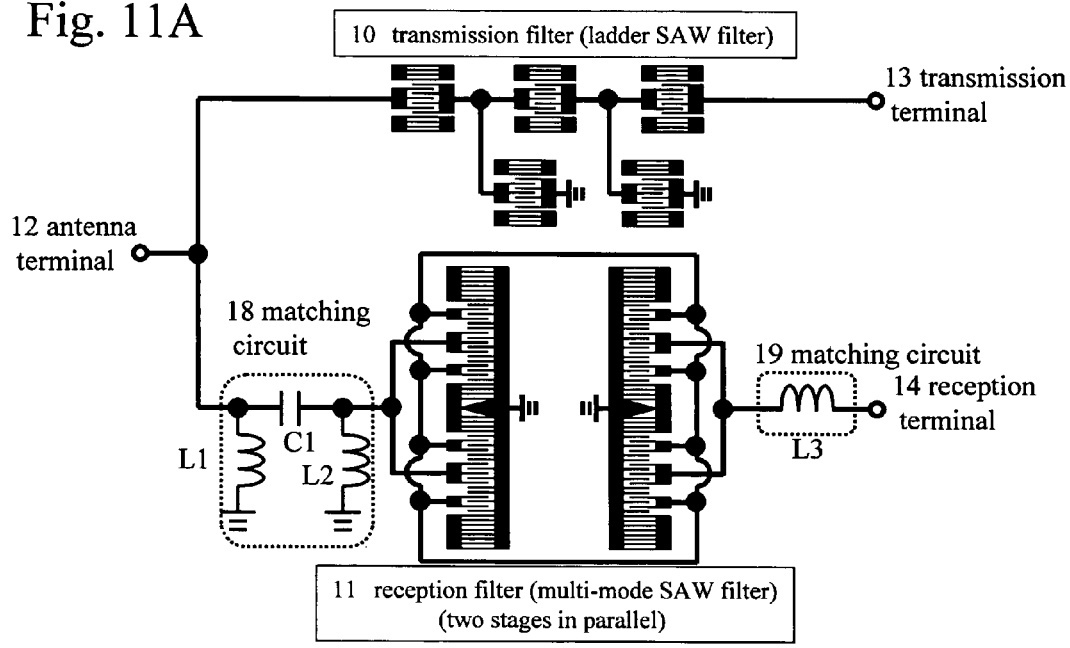
FIG. 11A is a circuit diagram of a duplexer in accordance with a second embodiment of the present invention.
Figure 11B:
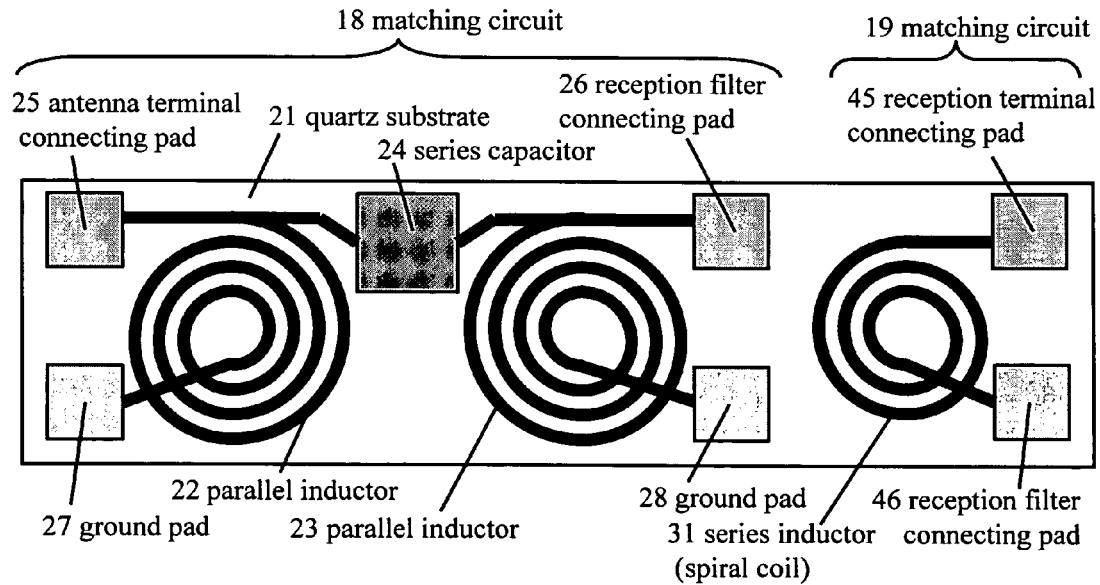
FIG. 11B is a front view of the lumped-constant matching circuits of the duplexer.

FIG. 11A illustrates a duplexer of a second embodiment that has a matching circuit 18 on the input side of a reception filter 11 and a matching circuit 19 on the output side of the reception filter 11. As shown in FIG. 11B, the two matching circuits 18 and 19 are formed on a quartz substrate 21 that is an insulating substrate. A filter chip 44 having the quartz substrate 21 shown in FIG. 11B includes not only the components shown in FIG. 5A, but also an inductor L3 that forms the matching circuit 19, and a reception terminal connecting pad 45 and a reception filter connecting pad 46 that are connected to both ends of the inductor L3. Like the inductors 22 and 23, the inductor L3 is in a spiral form, and is formed directly on the surface of the quartz substrate 21. Accordingly, not only the capacity coupling between the inductors L1 and L2 forming the matching circuit 18 but also the capacity coupling between the inductor L3 of the matching circuit 19 and the inductors L1 and L2 of the matching circuit 18 is reduced. Thus, not only the interference in one matching circuit but also the interference between different matching circuits can be restricted. In this manner, a duplexer that is small but exhibits high performance can be realized. In the duplexer illustrated in FIG. 11A, the reception filter 11 has a structure in which two multi-mode SAW filters are connected in parallel, and the transmission filter 10 is a ladder type SAW filter. However, the transmission filter 10 and the reception filter 11 are not limited to those structures, but may be formed with SAW filters of other types.

Figure 12:
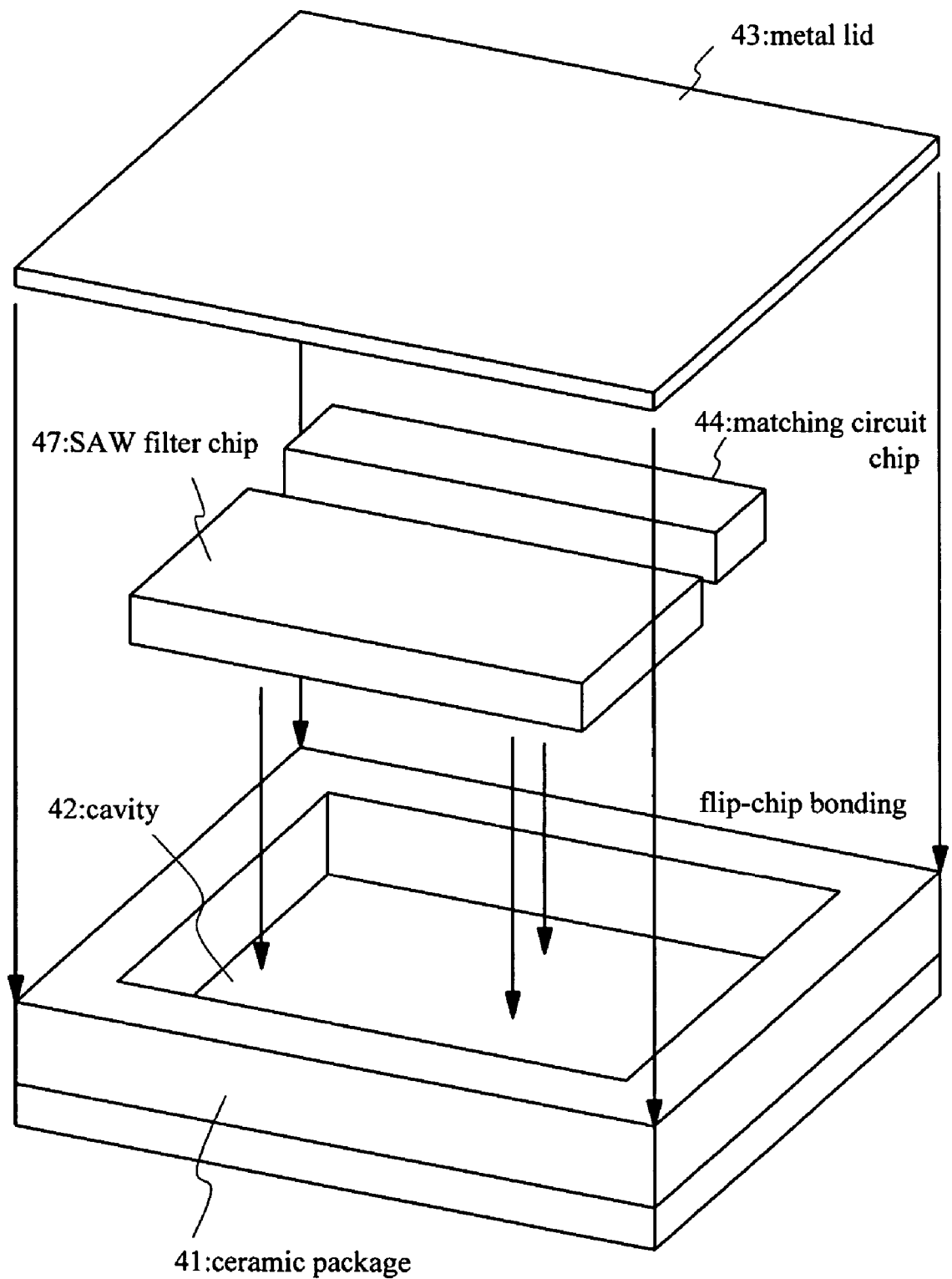
FIG. 12 is an exploded perspective view of the duplexer in accordance with the second embodiment.

FIG. 12 is an exploded perspective view of the duplexer shown in FIGS. 11A and 11B. A SAW filter chip 47 has the IDT pattern of the transmission filter 10 and the reception filter 11 of FIG. 11B formed on a single piezoelectric substrate. The SAW filter chip 47 and a matching circuit chip 44 are mounted in a cavity 42 of a ceramic package 41 by flip-chip bonding, and the cavity 42 is sealed with a metal lid 43. The transmission filter 10 and the reception filter 11 may be formed with SAW filter chips that are independent of each other.

Third Embodiment

Figure 13:
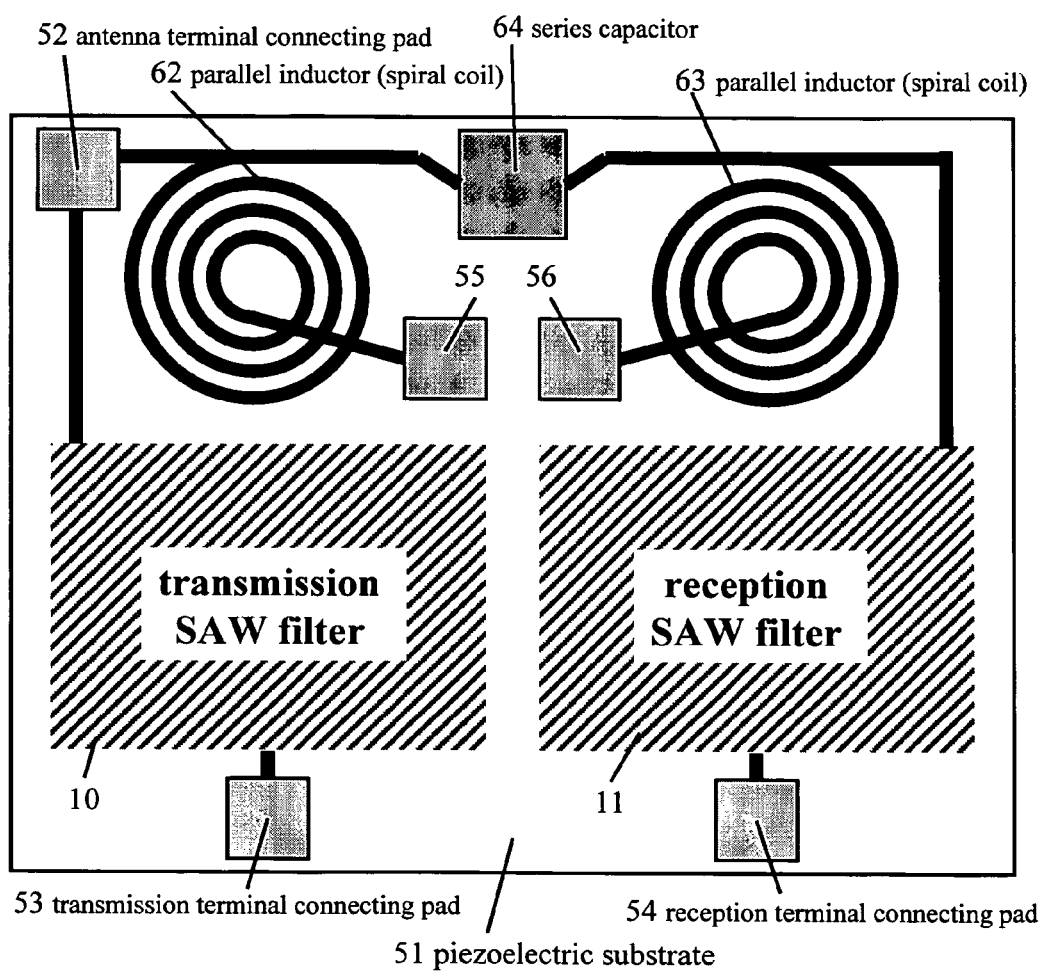
FIG. 13 is a plan view of the chip to be employed in a duplexer in accordance with a third embodiment of the present invention.

FIG. 13 is a plan view of a duplexer of a third embodiment of the present invention. This duplexer has a structure in which a transmission filter 10 and a reception filter 11 formed with SAW filters, parallel inductors 62 and 63, and a series capacitor 64 are formed on a single piezoelectric substrate 51. The parallel inductors 62 and 63 and the series capacitor 64 form the matching circuit 18 (see FIG. 3) with the circuit structure illustrated in FIG. 4B. The parallel inductors 62 and 63 are spiral coils, and the series capacitor 64 has the structure illustrated in FIG. 5B, for example. An antenna terminal connecting pad 52, a transmission terminal connecting pad 53, a reception terminal connecting pad 54, and ground pads 55 and 56 are also formed on the piezoelectric substrate 51. As the transmission filter 10, the reception filter 11, and the matching circuit 18 are formed on the single piezoelectric substrate 51, the number of required components is reduced, and the duplexer can be made smaller and shorter. The matching circuit formed on the piezoelectric substrate 51 is not limited to the matching circuit 18, but may be a matching circuit of a different type.

Figure 14:
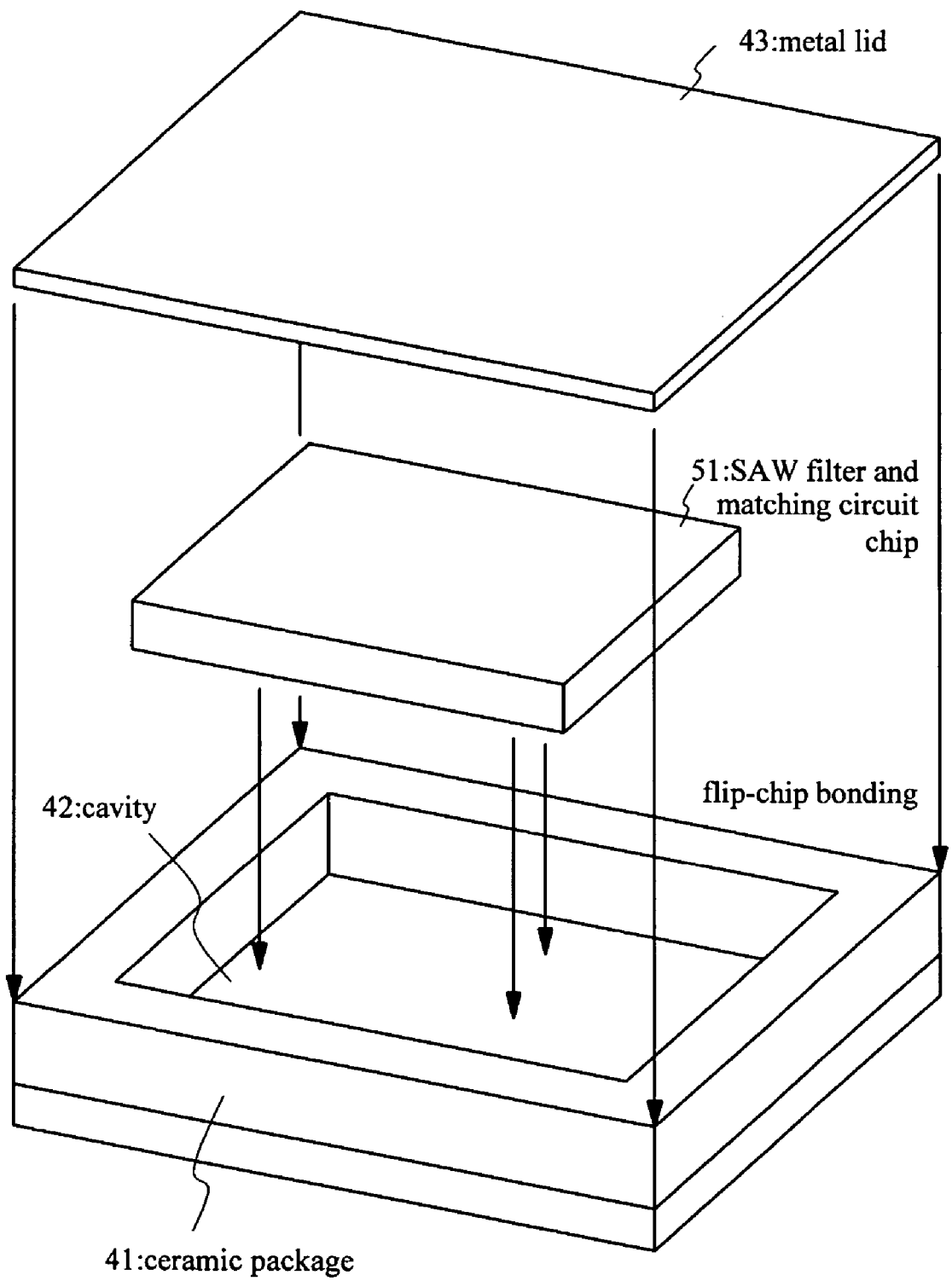
FIG. 14 is an exploded perspective view of the duplexer in accordance with the third embodiment.

FIG. 14 is an exploded perspective view of a duplexer that has the piezoelectric substrate 51 of FIG. 13 flip-chip bonded into a cavity 42 of a ceramic package 41, with a metal lid 43 sealing the cavity 42.

Figure 15:
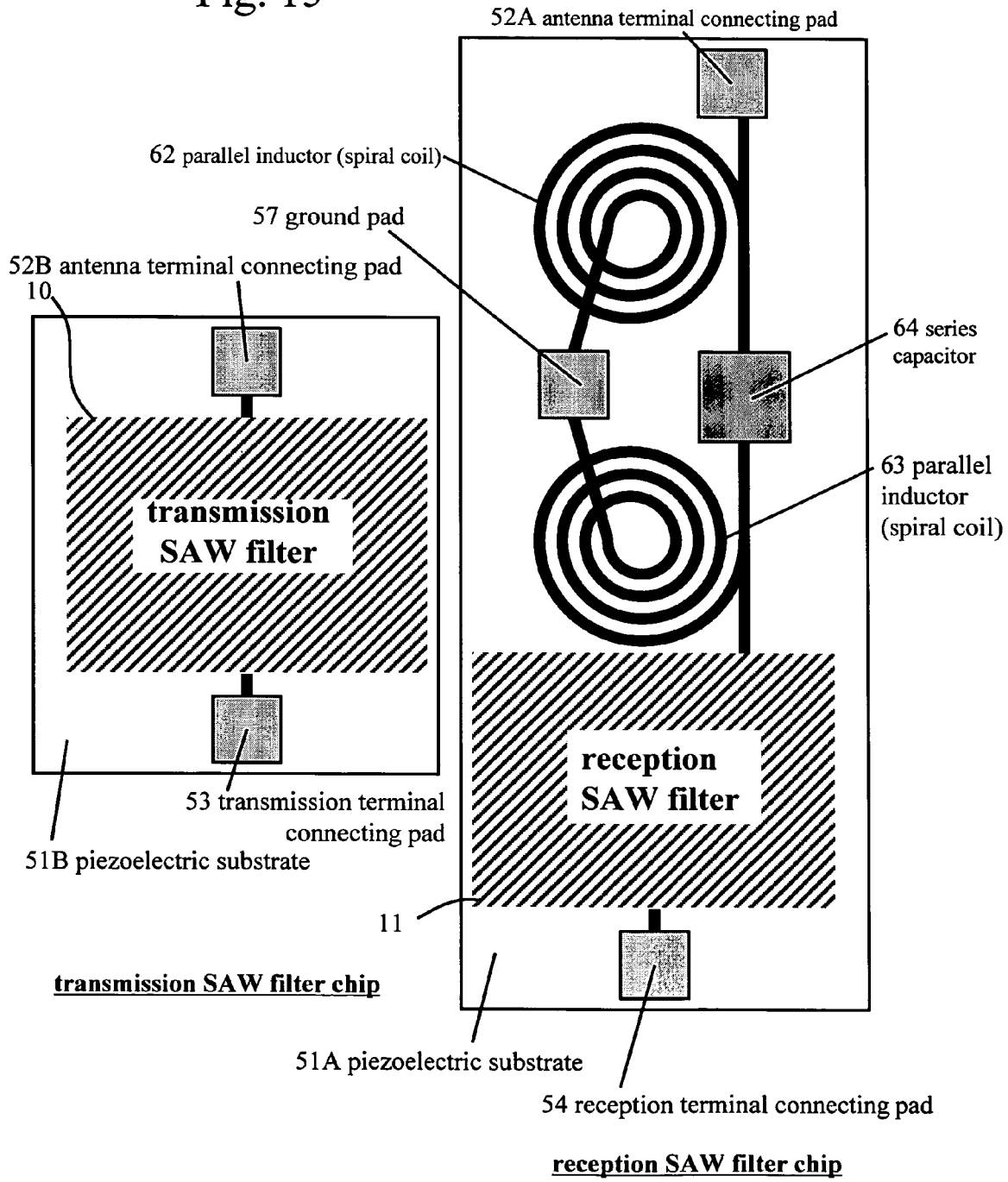
FIG. 15 is a plan view of piezoelectric substrate chips to be employed in a modification of the third embodiment.

FIG. 15 illustrates a modification of the third embodiment. In this modification, the transmission filter 10 and the reception filter 11 are formed on piezoelectric substrates 51B and 51A, respectively, and the matching circuit 18 is formed on the piezoelectric substrate 51A. In this structure, the matching circuit 18 is provided on one of the two piezoelectric substrates 51A and 51B. The reception SAW filter 11, the two parallel inductors 62 and 63 formed with spiral coils, the series capacitor 64, an antenna terminal connecting pad 52A, the reception terminal connecting pad 54, and the ground pad 57 are formed on the piezoelectric substrate 51A. The transmission SAW filter 10, an antenna terminal connecting pad 52B, and the transmission terminal connecting pad 53 are formed on the piezoelectric substrate 51B. The matching circuit formed on the piezoelectric substrate 51A is not limited to the matching circuit 18, but may be a matching circuit of a different type. Depending on the type of the matching circuit, it may be formed on the piezoelectric substrate 51B, instead of the piezoelectric substrate 51A.

Figure 16:
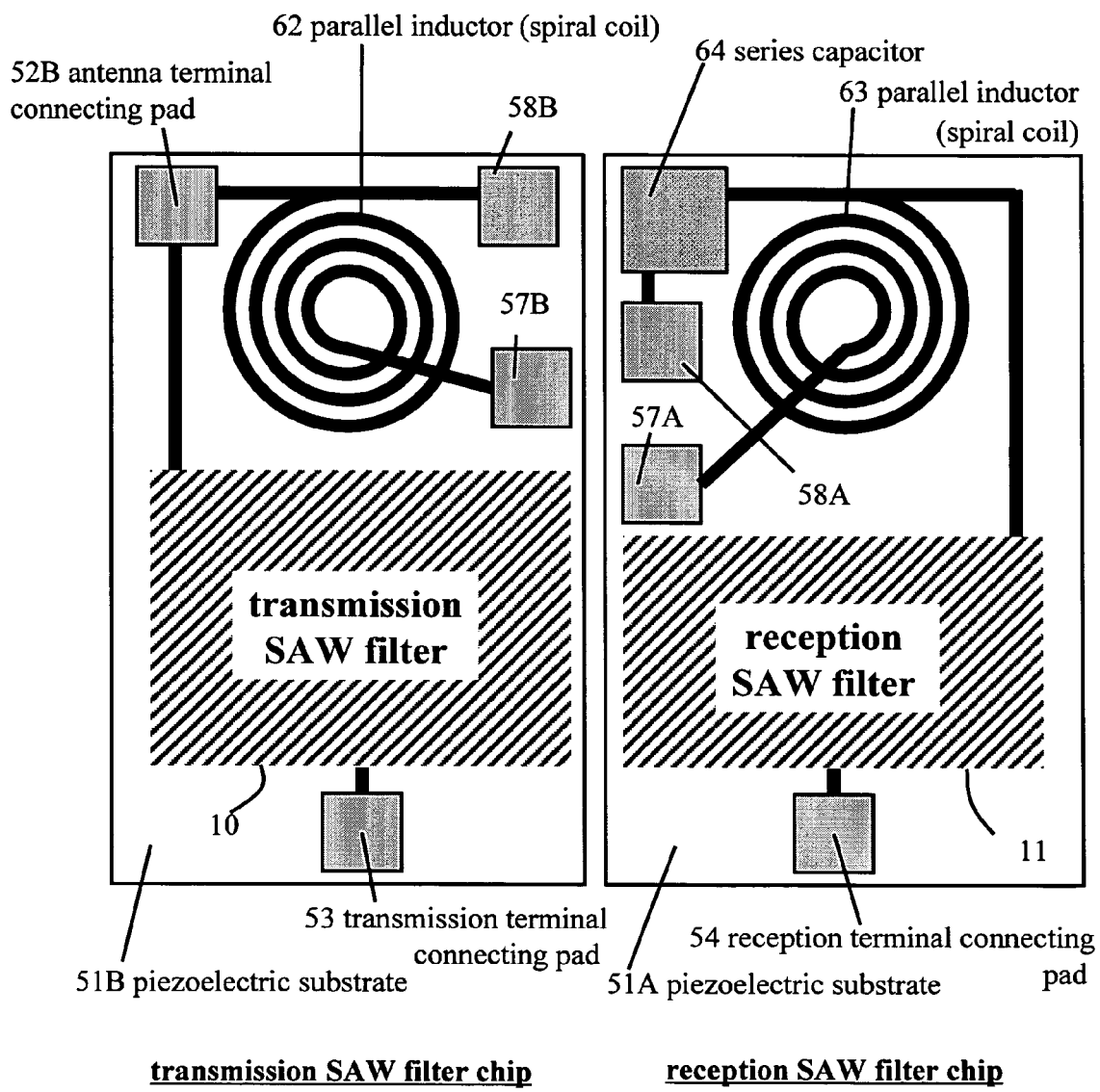
FIG. 16 is a plan view of piezoelectric substrate chips to be employed in another modification of the third embodiment.

FIG. 16 illustrates another modification of the third embodiment. In this modification, the transmission filter 10 and the reception filter 11 are formed on the separate piezoelectric substrates 51B and 51A, respectively, and the matching circuit 18 is divided and then disposed on the piezoelectric substrates 51A and 51B. More specifically, among the components of the matching circuit 18, the parallel inductor 62 is formed on the piezoelectric substrate 51B, and the parallel inductor 63 and the capacitor 64 are formed on the piezoelectric substrate 51A. A pad 58B to be connected to one end of the parallel inductor 62 is disposed on the piezoelectric substrate 51B, and a pad 58A to be connected to one end of the capacitor 64 and one end of the parallel inductor 63 is disposed on the piezoelectric substrate 51A. These pads are connected with a wiring pattern formed on a ceramic package, thereby forming the matching circuit 18. Further, a ground pad 57B to be connected to the other end of the parallel inductor 62 is formed on the piezoelectric substrate 51B, and a ground pad 57A to be connected to the other end of the parallel inductor 63 is formed on the piezoelectric substrate 51A. Although the piezoelectric substrates 51A and 51B differ in size in the structure illustrated in FIG. 15, the piezoelectric substrates 51A and 51B may be substantially the same in size in the structure illustrated in FIG. 16. The method of dividing the matching circuit 18 is not limited to the example shown in FIG. 16, but the matching circuit 18 may be divided in a different manner. Also, the matching circuits other than the matching circuit 18 may be divided and disposed on the piezoelectric substrates 51A and 51B. As can be seen from the structures illustrated in FIGS. 15 and 16, a matching circuit that is a reactance circuit can be formed on at least one of the two piezoelectric substrates. Either of the structures illustrated in FIGS. 15 and 16 and any modification of the structures illustrated in FIGS. 15 and 16 can be hermetically sealed in a package as described above.

Fourth Embodiment

Figure 17:
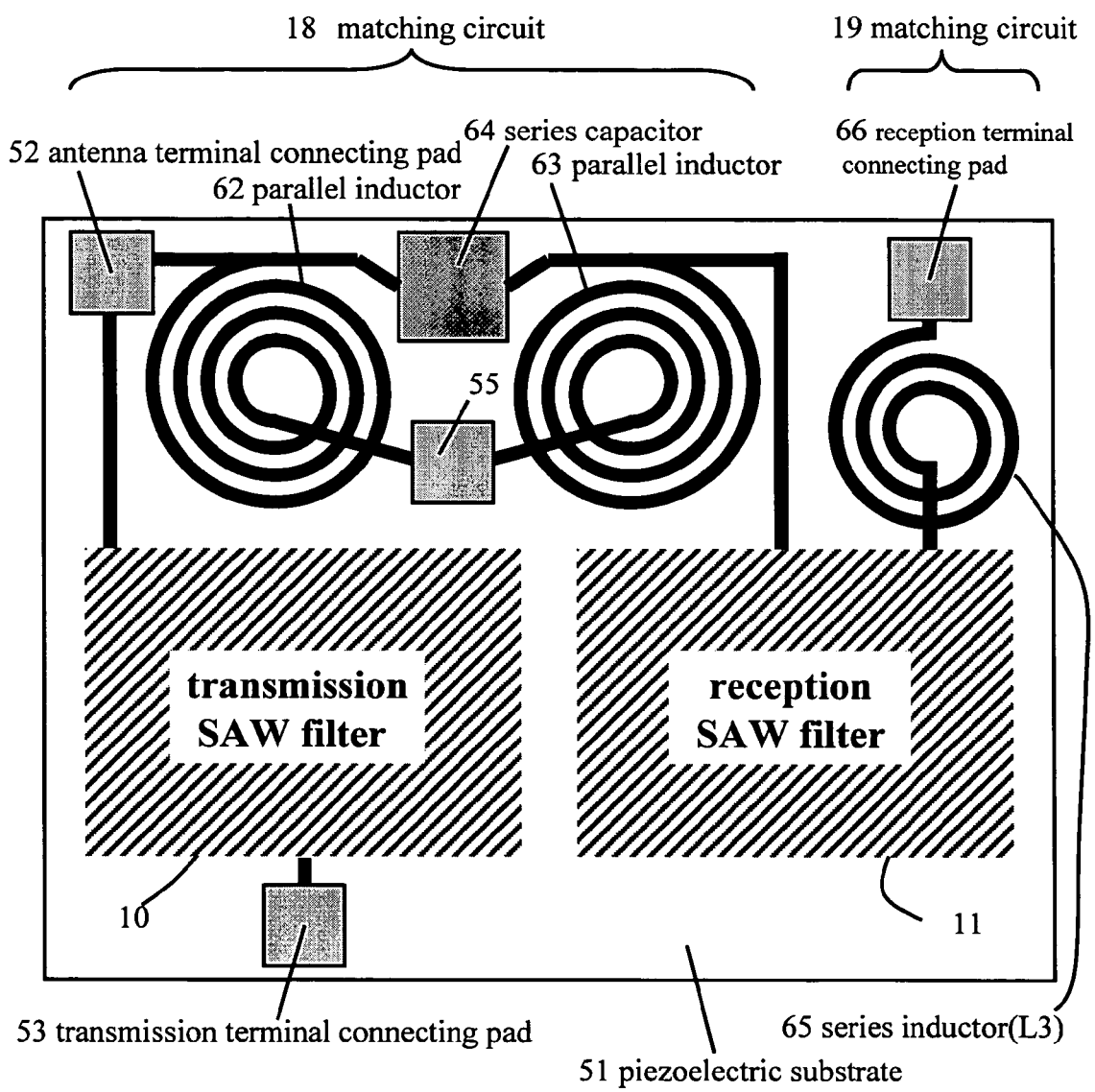
FIG. 17 is a plan view of a piezoelectric substrate chip to be employed in a duplexer in accordance with a fourth embodiment of the present invention.

FIG. 17 is a plan view of a duplexer that has the circuit structure of FIG. 11A formed on a single piezoelectric substrate 51. In the duplexer illustrated in FIG. 17, a series inductor 65 that forms a matching circuit 19 is disposed on the piezoelectric substrate 51 illustrated in FIG. 13. The series inductor 65 is a spiral coil. One end of the series inductor 65 is connected to a reception terminal connecting pad 66, and the other end of the series inductor 65 is connected to the reception SAW filter 11. The transmission SAW filter 10 and the reception SAW filter 11 are formed on the single piezoelectric substrate 51, and more than one matching circuit is also formed on the single piezoelectric substrate 51. Accordingly, the duplexer can be made much smaller and shorter. Instead of the matching circuits 18 and 19, or in addition to the matching circuits 18 and 19, other matching circuits may be formed on the piezoelectric substrate 51.

Fifth Embodiment

Figure 18:
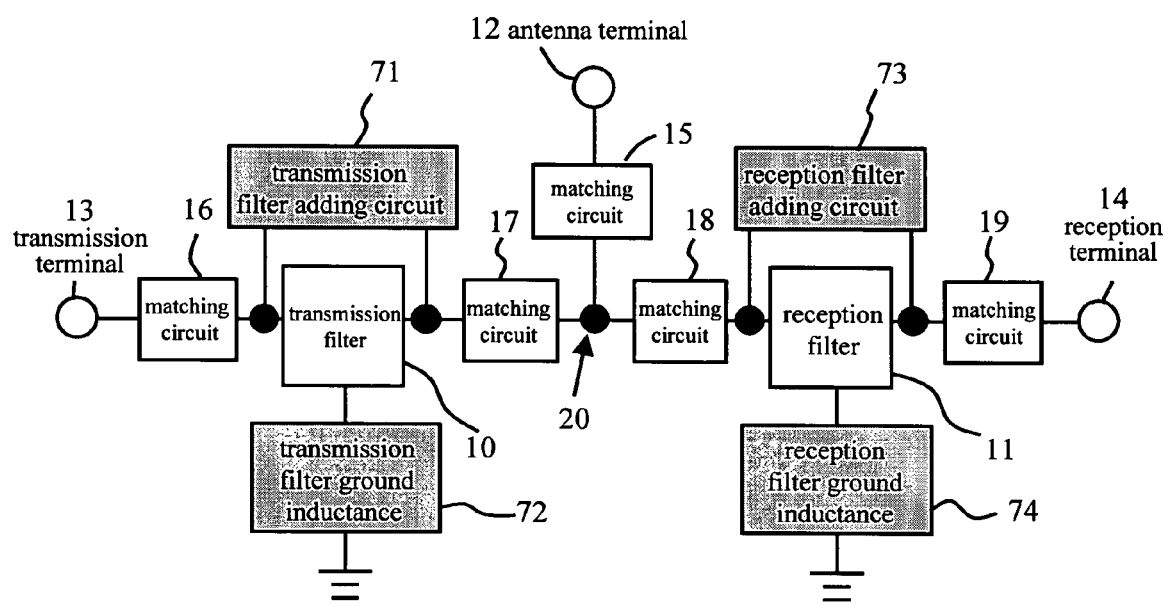
FIG. 18 shows the locations at which additional reactance elements might be disposed.

FIG. 18 illustrates a duplexer that has locations at which additional reactance elements other than the matching circuits 15 through 19 might be disposed. A transmission filter adding circuit 71 is interposed between the input terminal and the output terminal of a transmission filter 10. A transmission filter ground inductance circuit 72 is interposed between the electrode on the ground side of the transmission filter 10 and the ground. A reception filter adding circuit 73 is interposed between the input terminal and the output terminal of a reception filter 11. A reception filter ground inductance circuit 74 is interposed between the electrode on the ground side of the reception filter 11 and the ground.

Figure 19:
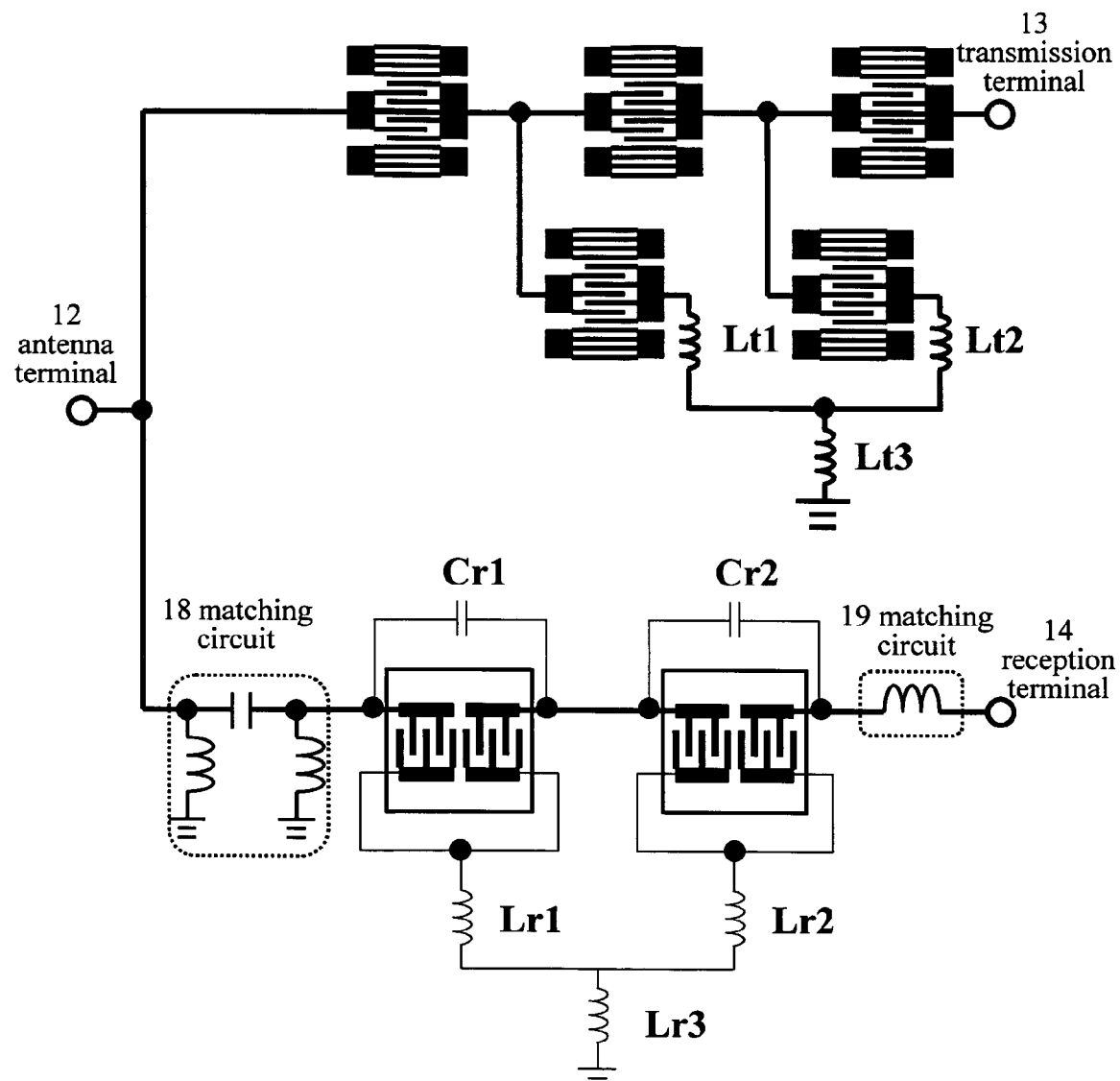
FIG. 19 is a circuit diagram of a duplexer in accordance with a fifth embodiment of the present invention.

FIG. 19 illustrates a duplexer that includes the transmission filter ground inductance circuit 72, the reception filter adding circuit 73, and the reception filter ground inductance circuit 74 among the above described reactance elements that have the possibility of being added to the duplexer. This duplexer includes the matching circuits 18 and 19. The transmission filter ground inductance circuit 72 includes inductors Lt1, Lt2, and Lt3. The inductors Lt1 and Lt2 are connected to the ground electrodes of two parallel-arm resonators that are provided in the transmission filter 10. The inductors Lt1 and Lt2 are grounded via the inductor Lt3. The reception filter adding circuit 73 includes capacitors Cr1 and Cr2. In the structure illustrated in FIG. 19, the reception filter 11 is schematically shown, and actually has the structure illustrated in FIG. 11A. The capacitor Cr1 is connected between the input terminal and the output terminal of the IDT of the previous stage, and the capacitor Cr2 is connected between the input terminal and the output terminal of the IDT of the later stage. Further, inductors Lr1 and Lr2 are connected to the ground electrodes of the IDTs of the previous and later stages. The inductors Lr1 and Lr2 are grounded via an inductor Lr3.

Figure 20:
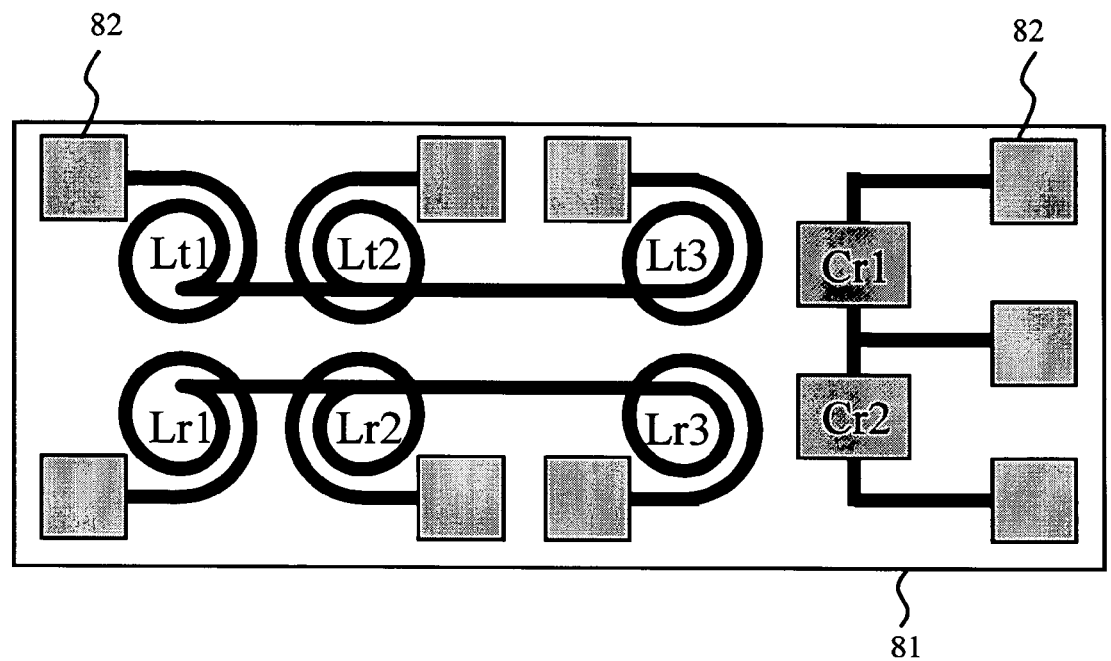
FIG. 20 illustrates an example structure in which the additional reactance elements shown in FIG. 19 are formed on the surface of an insulating substrate.

In the fifth embodiment, the above described additional reactance elements are formed with lumped-constant circuit elements. An example of the structure is illustrated in FIG. 20. This structure is a chip in which the inductors Lt1 through Lt3 and Lr1 through Lr3, and the capacitors Cr1 and Cr2 are formed on the surface of an insulating substrate 81 made of quartz glass, for example. To establish the connection with the outside, pads 82 are formed on the insulating substrate 81. The chip of such an additional circuit as well as SAW filter chips and matching circuit chips are hermetically sealed in a package.

Sixth Embodiment

Figure 21:
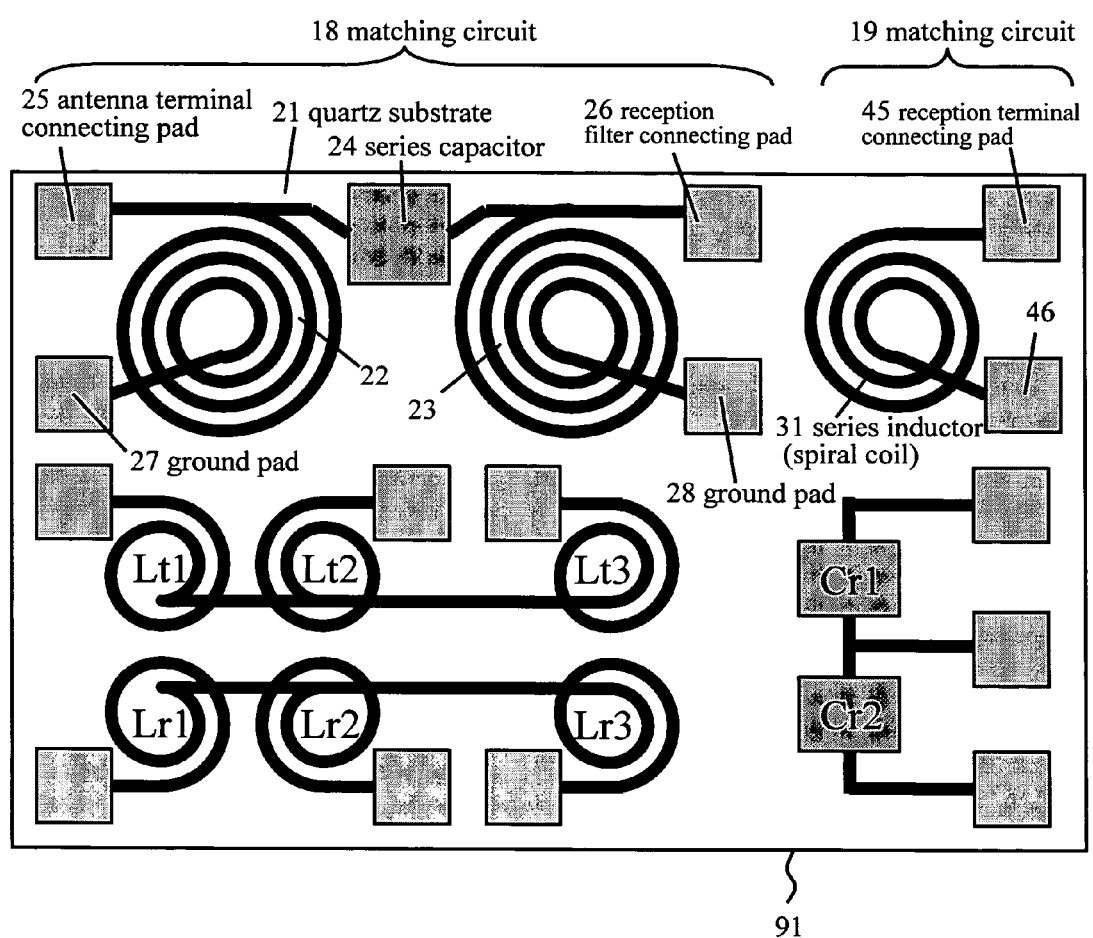
FIG. 21 is a plan view of the piezoelectric substrate chip to be employed in a duplexer in accordance with a sixth embodiment of the present invention.

FIG. 21 illustrates a chip in which additional reactance elements as well as matching circuits are formed directly on the surface of one insulating substrate. The reactance elements shown in FIG. 11B and the reactance elements shown in FIG. 20 are formed on an insulating substrate 91 of a duplexer in accordance with a sixth embodiment of the present invention. Using this chip, an even smaller duplexer can be realized, and the production costs can be reduced.

Although a few preferred embodiments of the present invention have been shown and described, it would be appreciated by those skilled in the art that changes may be made in these embodiments without departing from the principles and spirit of the invention, the scope of which is defined in the claims and their equivalents.

What is claimed is:

1. A duplexer comprising:
   a transmission filter and a reception filter that are connected to a common terminal, each of the transmission filter and the reception filter being composed of acoustic wave resonators formed on single substrates, respectively, or both of the transmission filter and the reception filter being composed of acoustic wave resonators formed on a single substrate; and
   a reactance circuit that is connected to at least one of the transmission filter and the reception filter,
   the reactance circuit including an insulating substrate, a plurality of lumped-constant inductors, and at least one capacitor, the plurality of lumped-constant inductors and the at least one capacitor being formed directly on a surface of the insulating substrate so that patterned conductive materials of the lumped-constant inductors formed by spiral coils are directly formed on the surface of the insulating substrate, the lumped-constant inductors formed by spiral coils facing only a non-grounded opposite surface of the insulating substrate,
   a chip having the transmission filter and the reception filter or chips respectively having the transmission filter and the reception filter and the insulating substrate being provided on another substrate.

2. A duplexer comprising:
   a transmission filter and a reception filter that are connected to a common terminal, each of the transmission filter and the reception filter being composed of acoustic wave resonators formed on single substrates, respectively, or both of the transmission filter and the reception filter being composed of acoustic wave resonators formed on a single substrate; and
   a reactance circuit that is designed for phase matching and is connected to at least one of the transmission filter and the reception filter,
   the reactance circuit including an insulating substrate and at least one of a lumped-constant inductor formed by a spiral coil and a capacitor, the lumped-constant inductor and the capacitor being formed directly on a surface of the insulating substrate, the lumped-constant inductor formed by a spiral coil facing only a non-grounded opposite surface of the insulating substrate,
   an inductor to be connected to at least one of the transmission filter and the reception filter being formed directly on the surface of the insulating substrate,
   a chip having the transmission filter and the reception filter or chips respectively having the transmission filter and the reception filter and the insulating substrate being provided on another substrate.

3. The duplexer as claimed in claim 1, wherein the inductors include a pattern that is formed on the surface of the insulating substrate.

4. The duplexer as claimed in claim 1, wherein the reactance circuit is disposed between the common terminal and the reception filter and/or between the reception filter and a reception terminal.

5. The duplexer as claimed in claim 1, wherein the reactance circuit is disposed between the common terminal and the transmission and reception filters, and/or between the transmission filter and a transmission terminal.

6. The duplexer as claimed in claim 1,
   wherein said another substrate is a part of a package that contains the transmission filter, the reception filter, and the insulating substrate in a cavity; and
   the duplexer further comprises a lid that seals the cavity.

7. The duplexer as claimed in claim 1, wherein:
   the transmission filter comprises a first piezoelectric substrate, and an interdigital transducer that is formed on the first piezoelectric substrate; and
   the reception filter comprises a second piezoelectric substrate, and an interdigital transducer that is formed on the second piezoelectric substrate.

8. The duplexer as claimed in claim 1, wherein:
   the transmission filter comprises a piezoelectric substrate, and an interdigital transducer that is formed on the piezoelectric substrate; and
   the reception filter comprises the piezoelectric substrate, and an interdigital transducer that is formed on the piezoelectric substrate.

9. The duplexer as claimed in claim 1, wherein the transmission filter and the reception filter are surface acoustic wave filters.

10. The duplexer as claimed in claim 1, wherein the transmission filter is a ladder-type surface acoustic wave filter, and the reception filter is a multi-mode surface acoustic wave filter.

* * * * *

UNITED STATES PATENT AND TRADEMARK OFFICE
CERTIFICATE OF CORRECTION

PATENT NO. : 7,479,846 B2  Page 1 of 1
APPLICATION NO. : 11/262765
DATED : January 20, 2009
INVENTOR(S) : Shogo Inoue et al.

It is certified that error appears in the above-identified patent and that said Letters Patent is hereby corrected as shown below:

On the title page, item:

In (73) Assignees

Please delete

"Tokyo, Japan"

Please add

-- Kawasaki, Japan --

Signed and Sealed this

Nineteenth Day of January, 2010

David J. Kappos
*Director of the United States Patent and Trademark Office*